United States Patent [19]

Huang et al.

[11] Patent Number: 5,718,034
[45] Date of Patent: Feb. 17, 1998

[54] ALUMINUM STABILIZED SUPERCONDUCTOR SUPPORTED BY ALUMINUM ALLOY SHEATH

[75] Inventors: Xianrui Huang, Forest; Gregory Alan Lehmann, Evington; Yury Lvovsky, Lynchburg; Ronald Glenn Wood, Forest, all of Va.

[73] Assignee: The Babcock & Wilcox Company, New Orleans, La.

[21] Appl. No.: 712,781

[22] Filed: Sep. 12, 1996

Related U.S. Application Data

[62] Division of Ser. No. 443,305, May 17, 1995, Pat. No. 5,620,798.
[51] Int. Cl.⁶ ............................................. H01L 39/24
[52] U.S. Cl. ................... 29/599; 174/125.1; 505/430; 505/433
[58] Field of Search .................. 29/599; 505/430, 505/433; 174/125.1

[56] References Cited

U.S. PATENT DOCUMENTS

| | | | |
|---|---|---|---|
| 3,372,470 | 3/1968 | El Bindari | 29/599 |
| 4,334,123 | 6/1982 | Tada et al. | 29/599 R |
| 4,454,380 | 6/1984 | Turowski | 29/599 X |

FOREIGN PATENT DOCUMENTS

| | | | |
|---|---|---|---|
| 4-71112 | 3/1992 | Japan | 29/599 |
| 5-182536 | 7/1993 | Japan | 29/599 |

Primary Examiner—Carl J. Arbes
Attorney, Agent, or Firm—Robert J. Edwards; Michael L. Hoelter

[57] ABSTRACT

A new design for an aluminum stabilized superconductor which embeds the superconducting cable within a high purity aluminum stabilizer. This stabilizer is, in turn, partially surrounded by an aluminum alloy sheath. The aluminum alloy sheath is constructed and arranged so that at least one exterior surface of the stabilizer is open for exposure to a coolant. Preferably, this open exterior surface of the stabilizer will be knurled for greater cooling efficiency.

10 Claims, 2 Drawing Sheets ered or brazed together before being fully enclosed
ALUMINUM STABILIZED SUPERCONDUCTOR SUPPORTED BY ALUMINUM ALLOY SHEATH This application is a DIVISION of application Ser. No. 08/443,305, filed May 17, 1995 now U.S. Pat. No. 5,620,798 issued Apr. 15, 1997.

FIELD OF THE INVENTION

This invention pertains to a manner of mechanically supporting a superconducting cable which is embedded within a soft stabilizing material and more particularly to a new design that permits this soft stabilizing material to be directly exposed to the coolant for more efficient cooling of the superconducting cable.

BACKGROUND OF THE INVENTION

Many methods exist that mechanically support a superconducting cable that is embedded within a softer stabilizing material. U.S. Pat. No. 3,614,301 to Royet and U.S. Pat. No. 3,646,249 to Moisson-Franckhauser are typical of such devices. Both of them disclose a superconducting cable disposed within a tubular stabilizer which, in turn, is encased within an outer sheath. Coolant passes through the center of the tubular stabilizer thereby cooling the stabilizer as well as the embedded superconducting cables. In both cases, the outer sheath, which is constructed of a single unitary material, fully surrounds the stabilizer. The manner of fully enclosing the stabilizer within the unitary outer sheath is both cumbersome and difficult to construct if a tight bond between the two is desired. Also, the conductor will undergo a sharp pressure rise during quenching since it requires leak-tight manifolding.

U.S. Pat. No. 3,432,783 to Britton et al. discloses a layer of superconducting material attached to a substrate. The superconducting material is subsequently grooved so as to form multiple strips on the substrate. A layer of normal conductor material is then installed around both the superconducting material and the substrate such as by vapor deposition, electro-plating or the like. This conductor material is, in turn, enclosed within a thin insulative coating of aluminum oxide. Consequently, in this version, the coolant passes along the outside of the aluminum oxide coating so that any cooling of the embedded superconducting material must first pass through multiple insulative layers before any cooling action reaches the superconducting material. Also, the boundary between each such layer increases the thermal resistance that must be overcome to achieve cooling of the superconducting material.

Other devices of interest include U.S. Pat. No. 4,334,123 to Tada et al. which discloses a stabilizer having an open knurled passageway therethrough. This stabilizer is surrounded top and bottom by a pair of reinforcement members and on its sides by a pair of superconducting wires. U.S. Pat. No. 4,490,578 to Suzuki et al. discloses a plurality of superconductor wires encased within solder or the like which bonds to a pure copper housing. This solder also surrounds a reinforcing member and is capped by a lid constructed of a pure aluminum portion and a pure copper portion. U.S. Pat. No. 4,079,187 to Fillunger et al. discloses a superconducting cable which incorporates therein both stabilizing wires and reinforcing wires. This superconducting cable is placed within a groove in one stabilizing member with another stabilizing member placed thereover so as to cover the groove. The covering stabilizing member contains a passageway therein for the passage of a coolant therethrough. These stabilizing members themselves are soldered or brazed together before being fully enclosed within a steel sheath.

It is thus an object of this invention to provide a new design for and a different manner of manufacturing an aluminum stabilized superconductor which is supported by an aluminum alloy sheath. Another object of this invention is to provide a new design which incorporates an aluminum alloy sheath that is composed of multiple components which are individually attached or secured together so as to provide support to a stabilizer. Yet another object of this invention is to provide a new design for such a sheath that does not fully enclose the stabilizer but instead only partially surrounds the stabilizer thereby permitting one side of the stabilizer to be directly exposed to the coolant for greater cooling of the embedded superconducting material. It is another object of this invention for such coolant to flow outside the stabilizer rather than through a passageway within the stabilizer. Still another object of this invention is to provide a means of physically securing the enclosed stabilizer to the outer sheath, whether this outer sheath is of singular or multi-piece construction. These and other objects and advantages of this invention will become obvious upon further investigation.

SUMMARY OF THE INVENTION

What is disclosed is a conductor which consists of a superconducting cable that is surrounded by a high purity aluminum stabilizer. A sheath assembly, in turn, partially surrounds this stabilizer for support but this sheath stops short of fully enclosing the stabilizer. Instead, at least one side of the stabilizer remains uncovered by the sheath assembly so that this side remains open for (preferably direct) exposure to a coolant. This sheath is generally constructed of aluminum alloy and it may be of unitary or multi-piece construction.

DESCRIPTION OF THE PREFERRED EMBODIMENTS

Figure 1:
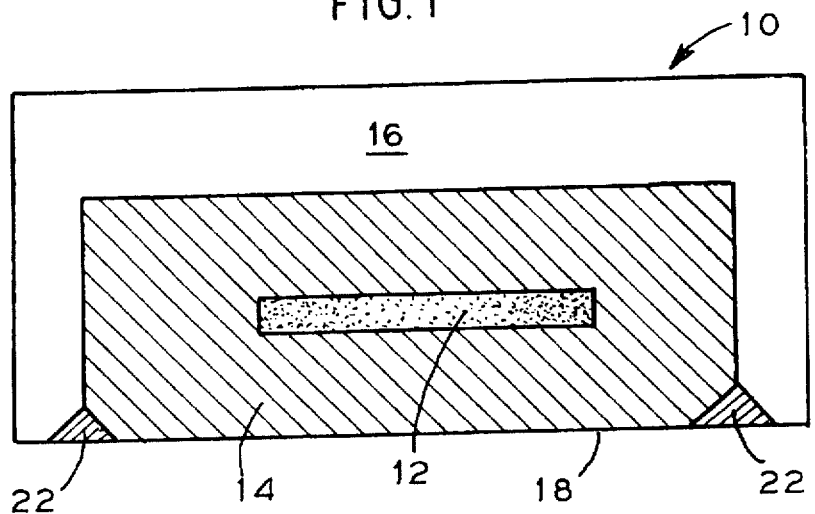
FIG. 1 is a pictorial view of the new design of a superconductor enclosed within a stabilizer that is supported by a sheath.

Referring initially to FIG. 1, there is shown superconductor 10 which, in this embodiment comprises superconducting cable 12, stabilizer 14, and sheath 16. Superconducting cable 12 may be a continuous ribbon of superconducting material or cable 12 may consist of a plurality of individual wires that are braided, twisted, or otherwise held together.

Stabilizer 14 is generally constructed of high purity aluminum that is soft and has extremely low electric resistivity at cryogenic temperatures. Such low resistivity is necessary for conductor stability and protection. Generally, superconducting cable 12 and stabilizer 14 will be co-extruded so as to achieve a good metallurgical bond between the two. Such a manner of construction will also reduce the thermal and electrical resistance values arising at their interface. Stabilizer 14 serves the purpose of stabilizing or steadying superconducting cable 12 during its cooling and use.

As indicated in FIG. 1, one side or surface 18 of stabilizer 14 is not enclosed by sheath 16. Instead, this surface 18 is open for direct exposure to the coolant (not shown) used to cool superconductor 10. It may also be desirable to knurl or roughen 20 surface 18 so as to enhance the cooling of both stabilizer 14 and superconducting cable 12. In any event, the direct contact with the coolant by stabilizer 14 as provided by the open nature of sheath 16 will enable superconductor 10 to be readily cooled so as to achieve the desired superconducting characteristics of cable 12.

Sheath 16 is also generally constructed of aluminum and it provides mechanical support to soft stabilizer 14. Such support is needed to counter or resist the Lorentz forces that arise within superconductor 10. This sheath 16 can be co-extruded with stabilizer 14 or sheath 16 can be welded (such as by TIG, laser or electron beam welding) to stabilizer 14 via welds 22. Other manners or methods can also be used to secure or lock sheath 16 with respect to stabilizer 14. In any event, a good mechanical bond between sheath 16 and stabilizer 14 is desired.

Figure 2:
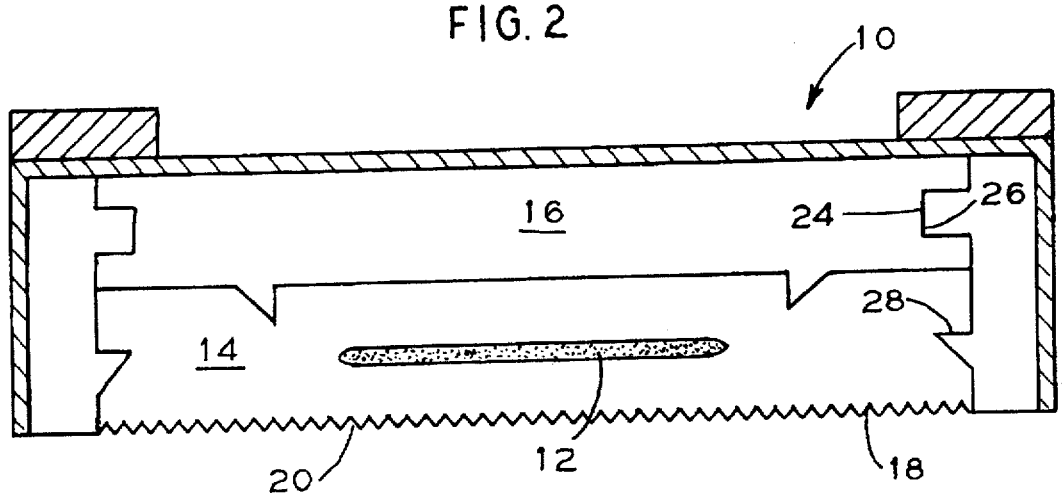
FIG. 2 is a pictorial view of an alternate design to that shown in FIG. 1 wherein the supporting sheath is constructed of multiple components which are fitted together.
Figure 3A:
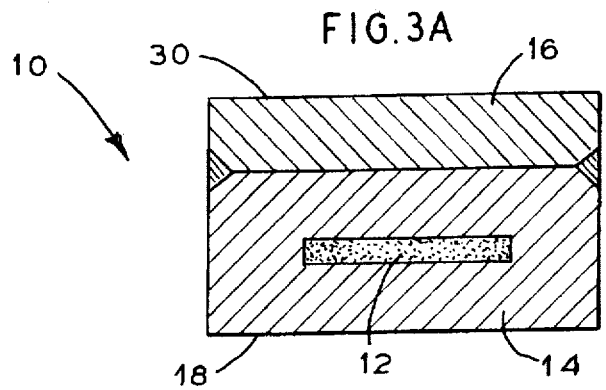
FIGS. 3a–3d are pictorial views of an alternate design to that shown in FIG. 2 wherein the various components of the sheath are illustrated as being welded or brazed together.
Figure 3B:
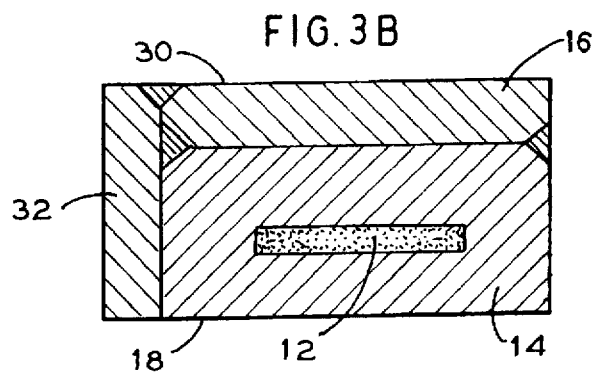
Figure 3C:
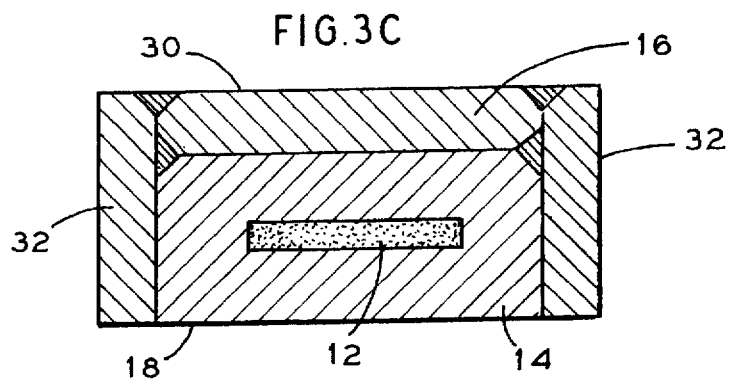
Figure 3D:
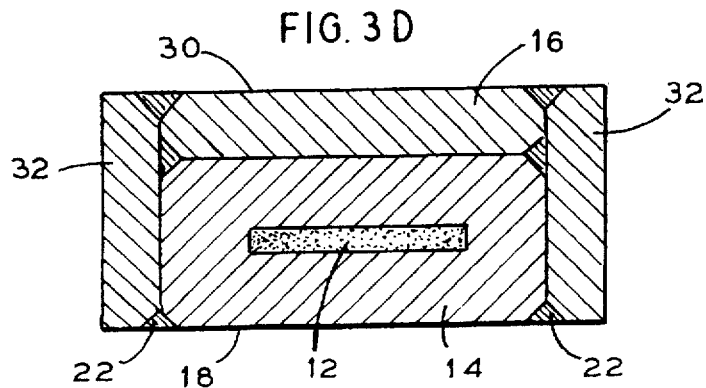

Referring now to FIG. 2, there is shown an alternate embodiment of superconductor 10 as disclosed in FIG. 1. In this alternate embodiment, sheath 16 is constructed of three separate pieces that are locked together around stabilizer 14. These separate pieces will normally be continuously extruded and typically will incorporate keys 24 and keyways 26 that interlock for proper alignment and fit. In this fashion, superconductor 10 can be continuously assembled as these co-extruded pieces are press-fit together around stabilizer 14. Additionally, teeth 28 can also be formed on these separate pieces that are designed to cut into the soft high purity aluminum of stabilizer 14 thereby further mechanically locking stabilizer 14 to sheath 16.

A further embodiment of the above multi-piece sheath 16 is shown in FIG. 3 (this is in contrast to the unitary sheath of FIG. 1). In this embodiment, the manner of constructing sheath 16 partially around stabilizer 14 is disclosed. First, upper sheath member 30 would be welded to the top of stabilizer 14 (FIG. 3a). Following this, one side member 32 and then the other opposite side member 32 would be secured to this upper sheath member 30 (FIGS. 3b and 3c). Finally, open side 18 of stabilizer 14 would be secured to the respective side members 32 of sheath 16 (FIG. 3d). In this fashion, each of the four corners of stabilizer 14 would be secured to adjacent sheath members 30 and 32 while still permitting stabilizer 14 to have a side or surface 18 that is not covered or enclosed for direct contact with the coolant. The normal fashion of securing such sheath members 30 and 32 to stabilizer 14 would be by TIG, laser, or electron beam welding or brazing, but other means of securing these members to stabilizer 14 would also be acceptable.

The above designs of superconductor 10 are ideal since superconductors are usually accompanied by large magnetic forces, large displacements and potentially large thermal disturbances. Consequently, such a superconductor 10 requires both a stable conductor 12 and reliable mechanical support for such conductor 12. Currently existing aluminum stabilized superconductors are either completely wrapped by a high strength sheath or they lack such a sheath altogether. The former (i.e. those with a totally enclosing sheath) have poor stability due to poor thermal conductivity of sheath material and the thermal resistance at the contact or interface between the stabilizer and the sheath material. The latter (i.e. those lacking a sheath altogether) do not have or incorporate sufficient mechanical support for the stabilizer which, as stated earlier, is constructed of soft, high purity aluminum. The new designs for superconductor 10 as disclosed herein satisfy both the need for stability and the need for mechanical support of the soft stabilizer. A further added benefit of such new designs for superconductor 10 are their ease of assembly which reduces their cost of manufacture. Also, since these designs incorporate aluminum, they are lighter in weight that other designs which incorporate copper. This is, therefore, an ideal choice for large superconducting coils.

What is claimed is:

1. A method of construction of a superconductor comprising the steps of:

(a) embedding a superconducting cable within a high purity aluminum stabilizer by co-extruding the cable and stabilizer; and, (b) partially surrounding said high purity aluminum stabilizer with a sheath which is constructed of aluminum alloy, said sheath supporting said stabilizer and constructed and arranged to leave a portion of the exterior surface of said stabilizer uncovered or open for exposure to a coolant.

2. The method as set forth in claim 1 further comprising the step of welding or brazing said sheath to said stabilizer.

3. The method as set forth in claim 2 further comprising the step of knurling said uncovered or open portion of the exterior surface of said stabilizer for greater cooling efficiency.

4. The method as set forth in claim 3 further comprising the step of constructing said sheath of a unitary aluminum alloy material.

5. A method of construction of a superconductor comprising the steps of:

(a) embedding a superconducting cable within a high purity aluminum stabilizer;

(b) partially surrounding said high purity aluminum stabilizer with a sheath which is constructed of aluminum alloy, said sheath supporting said stabilizer and constructed and arranged to leave a portion of the exterior surface of said stabilizer uncover or open for exposure to a coolant welding or brazing said sheath to said stabilizer knurling said uncovered or open portion of the exterior surface of said stabilizer for greater cooling efficiency; and constructing said sheath of a multi-piece aluminum alloy material.

6. The method as set forth in claim 5 further comprising the step of constructing and arranging said multi-piece sheath with keys and keyways therein for locking and aligning said multi-piece sheath together.

7. The method as set forth in claim 6 further comprising the step of constructing and arranging said multi-piece sheath with teeth therein for cutting into and mechanically locking said sheath to said stabilizer.

8. The method as set forth in claim 5 further comprising the step of generally constructing said stabilizer as a polygon and the further step of securing and covering multiple exterior surfaces of said stabilizer with multiple sheath members while leaving at least one exterior surface of said stabilizer uncovered or open for exposure to a coolant.

9. The method as set forth in claim 8 further comprising the step of securing and abutting said sheath members together.

10. A method of construction of a superconductor comprising the steps of:

(a) embedding a ribbon-shaped superconducting cable within a high purity polygonal aluminum stabilizer; and, (b) partially surrounding said high purity aluminum stabilizer with a sheath which is constructed of aluminum alloy, said sheath supporting said stabilizer and constructed and arranged to leave a broad side of the exterior surface of said stabilizer uncovered or open for exposure to a coolant.

* * * * *